United States Patent
Park et al.

(10) Patent No.: US 10,509,062 B2
(45) Date of Patent: Dec. 17, 2019

(54) METHOD OF MEASURING FREQUENCY OF COORDINATE INDICATING DEVICE, AND ELECTRONIC APPARATUS THEREOF

(71) Applicant: SAMSUNG ELECTRONICS CO., LTD., Suwon-si (KR)

(72) Inventors: Sung-soo Park, Suwon-si (KR); Gwan-hyung Kim, Suwon-si (KR); Byung-jik Kim, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 811 days.

(21) Appl. No.: 14/557,825

(22) Filed: Dec. 2, 2014

(65) Prior Publication Data
US 2015/0168466 A1 Jun. 18, 2015

(30) Foreign Application Priority Data

Dec. 13, 2013 (KR) ........................ 10-2013-0155639

(51) Int. Cl.
*G01R 23/02* (2006.01)
*G06F 3/041* (2006.01)
(Continued)

(52) U.S. Cl.
CPC ............. *G01R 23/02* (2013.01); *G01B 7/004* (2013.01); *G06F 3/03545* (2013.01);
(Continued)

(58) Field of Classification Search
CPC ..... G01R 23/02; G06F 3/046; G06F 3/03545; G06F 3/0416; G06F 2203/04106;
(Continued)

(56) References Cited

U.S. PATENT DOCUMENTS

| | | |
|---|---|---|
| 5,003,602 A | 3/1991 | Koyama |
| 5,134,689 A | 7/1992 | Murakami et al. |

(Continued)

FOREIGN PATENT DOCUMENTS

| | | |
|---|---|---|
| EP | 2 662 759 A2 | 11/2013 |
| JP | 2007-194965 | 8/2007 |
| JP | 2007194965 A | * 8/2007 |

OTHER PUBLICATIONS

Extended European Search Report dated Mar. 31, 2015 in corresponding European Patent Application No. 14196364.5.

(Continued)

*Primary Examiner* — Patrick Assouad
*Assistant Examiner* — Brent J Andrews
(74) *Attorney, Agent, or Firm* — Staas & Halsey LLP

(57) ABSTRACT

An electronic apparatus for measuring a frequency of an electromagnetic signal emitted from a coordinate indicating device contacting a sensor pad, and method are provided. The electronic apparatus includes a signal receiving unit that receives the electromagnetic signal, a band-pass filter unit including a pair of band-pass filters that generates a first filtered signal and a second filtered signal by respectively filtering the electromagnetic signal in a first frequency range and a second frequency range corresponding to a center frequency of the coordinate indicating device, and a controller that acquires a frequency value of the electromagnetic signal based on a ratio value between the first filtered signal and the second filtered signal.

17 Claims, 8 Drawing Sheets

(51) Int. Cl.
  *G06F 3/044*    (2006.01)
  *G06F 3/046*    (2006.01)
  *G06F 3/0354*   (2013.01)
  *G01B 7/004*    (2006.01)

(52) U.S. Cl.
  CPC .............. *G06F 3/044* (2013.01); *G06F 3/046* (2013.01); *G06F 3/0416* (2013.01); *G06F 2203/04104* (2013.01); *G06F 2203/04105* (2013.01); *G06F 2203/04106* (2013.01)

(58) Field of Classification Search
  CPC . G06F 2203/04105; G06F 2203/04104; G06F 3/044; G01B 7/004
  See application file for complete search history.

(56) References Cited

U.S. PATENT DOCUMENTS

| | | | |
|---|---|---|---|
| 2010/0085325 A1* | 4/2010 | King-Smith | G06F 3/03545 345/174 |
| 2011/0193825 A1 | 8/2011 | Yeh et al. | |
| 2013/0249823 A1* | 9/2013 | Ahn | G06F 3/038 345/173 |
| 2013/0300708 A1* | 11/2013 | Kim | G06F 3/0416 345/174 |

OTHER PUBLICATIONS

European Office Action dated Apr. 20, 2015 in corresponding European Patent Application No. 14196364.5.

\* cited by examiner

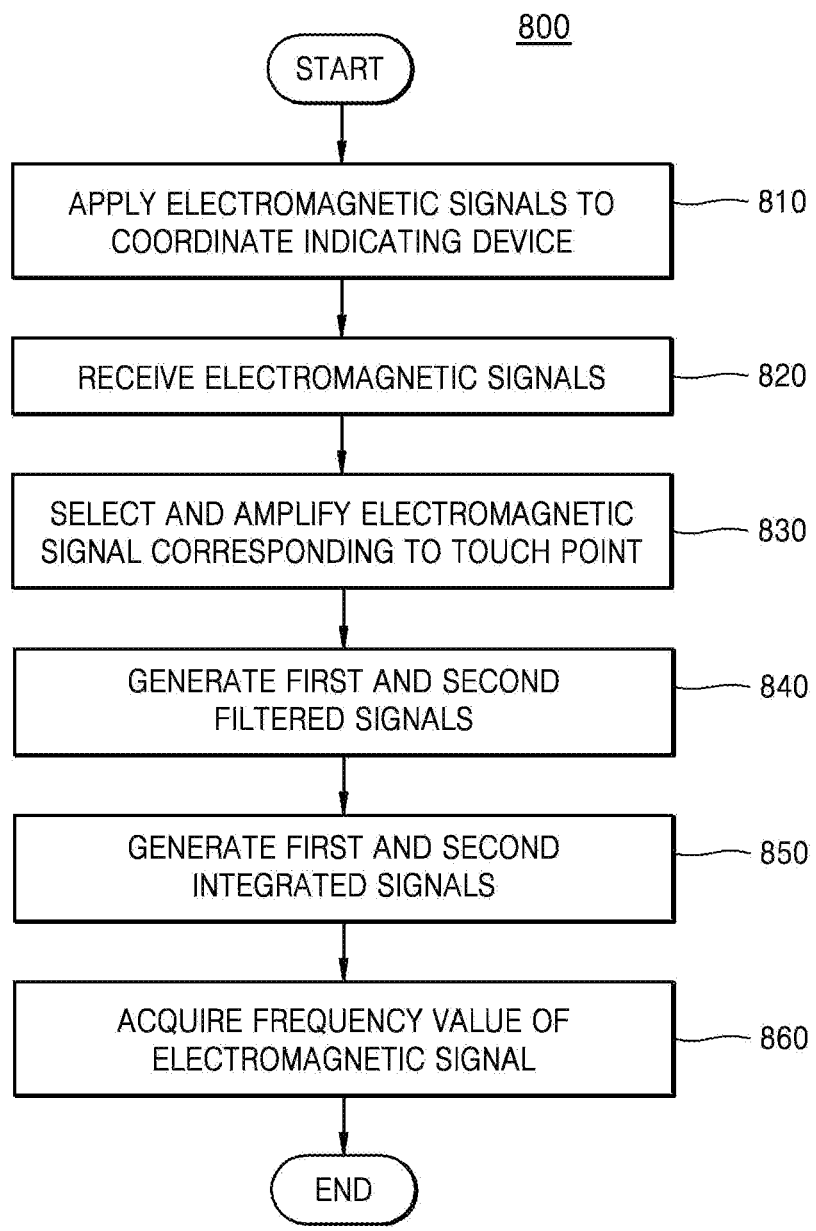

METHOD OF MEASURING FREQUENCY OF COORDINATE INDICATING DEVICE, AND ELECTRONIC APPARATUS THEREOF

CROSS-REFERENCE TO RELATED APPLICATIONS

This application is related to, and claims the priority benefit of, Korean Patent Application No. 10-2013-0155639, filed on Dec. 13, 2013, in the Korean Intellectual Property Office, the disclosure of which is incorporated herein in its entirety by reference.

BACKGROUND

1. Field

One or more embodiments relate to methods of measuring a frequency of a coordinate indicating device, and electronic apparatuses thereof, and more particularly, to methods of measuring a frequency of an electromagnetic signal generated by a coordinate indicating device, in order to sense a pen pressure of the coordinate indicating device on a sensor pad receiving the electromagnetic signal generated by the coordinate indicating device, and electronic apparatuses thereof.

2. Description of the Related Art

Various electronic apparatuses configured to output/input data from/to a touch screen through a touch pad have been developed.

An electronic apparatus includes a touch pad coupled with a display panel and senses a touch or access of a user or pen through the touch pad to receive an input of data. A method of inputting data to a display screen through the touch pad may be referred to as a touch screen input method.

A touch screen input method has been used to enable a user to input data to an electronic apparatus such as a portable computer such as a notebook computer, a netbook computer, or a tablet personal computer (PC); a portable terminal such as a smart phone, a portable multimedia player (PMP), or a personal digital assistant (PDA); or a smart television (TV).

The touch screen input method enables the user to input data to the electronic apparatus by touching a predetermined point on a display screen of the electronic apparatus, e.g., even without using an additional input/output unit such as a keyboard or a mouse. A user may directly perform a handwriting input or a graphic operation on the touch screen by using a coordinate indicating device. Thus, the electronic apparatus using the touch screen input method may provide an interface that increases the user's convenience.

The touch screen input method may be classified into a resistive method, an electrostatic method, or an electromagnetic resonance (EMR) method (or an electromagnetic method), depending on the method of detecting a point indicated by the user, for example, a touch point of the coordinate indicating device.

The resistive method senses a pressed point according to a current change when a voltage is applied, and senses that two conductive layers disposed on a screen are touched by a user or by a coordinate indicating device. The capacitive method senses a touch based on capacitance coupling. The EMR method senses a pen pressure and coordinate information of a coordinate indicating device by using a sensing panel including an array of electrodes and analyzing a phenomenon in which a coil installed in the coordinate indicating device stores and then returns energy in response to a specific frequency emitted from the sensing panel.

The EMR method may quickly and accurately implement a handwriting input of a user when the user writes on a touch screen by hand by using a coordinate indicating device.

In the EMR method, a pen pressure of the coordinate indicating device is related to a resonance frequency. In general, a pen pressure sensing circuit includes a variable capacitor or a variable inductor, and a resonance frequency changes when a capacitance value or an inductance value changes according to the level of pressure applied to a pen tip. Therefore, to accurately measure the pen pressure, it is necessary to provide an electronic apparatus and a method that may accurately measure a frequency of an electromagnetic signal emitted from the coordinate indicating device.

SUMMARY

One or more embodiments include a method of accurately measuring a frequency of an electromagnetic signal generated by a coordinate indicating device contacting a sensor pad to measure a pen pressure of the coordinate indicating device, and electronic apparatuses thereof.

Additional aspects will be set forth in part in the description which follows and, in part, will be apparent from the description, or may be learned by practice of the presented embodiments.

According to one or more embodiments, an electronic apparatus for measuring a frequency of an electromagnetic signal emitted from a coordinate indicating device contacting on a sensor pad includes a signal receiving unit that receives the electromagnetic signal, a band-pass filter unit including at least one band-pass filter that generates a first filtered signal and a second filtered signal by filtering the electromagnetic signal in a first frequency range and a second frequency range respectively, and a controller that acquires a frequency value of the electromagnetic signal based on a ratio value between the first filtered signal and the second filtered signal and the frequency value of the electromagnetic signal.

The controller may acquire the frequency value of the electromagnetic signal based on a relation between the ratio value between the first filtered signal and the second filtered signal and the frequency value of the electromagnetic signal.

The band-pass filter unit may include a first band-pass filter and a second band-pass filter, the first band-pass filter may receive the electromagnetic signal and filter the first frequency range to generate the first filtered signal, and the second band-pass filter may receive the electromagnetic signal and filter the second frequency range to generate the second filtered signal.

The band-pass filter unit may include a band-pass filter that receives the electromagnetic signal and filters the first frequency range in the electromagnetic signal to generate the first filtered signal, and then filters the second frequency range in the electromagnetic signal to generate the second filtered signal.

The electronic apparatus may include a memory that stores a lookup table representing the relation between the frequency value and the ratio value.

The electronic apparatus may include a memory that stores an equation representing the relation between the frequency value and the ratio value. The controller may acquire the frequency value by using the equation.

When the coordinate indicating device has n center frequencies, the band-pass filter unit may include n pairs of band-pass filters corresponding respectively to the n center frequencies.

When the coordinate indicating device has n center frequencies, the band-pass filter unit may include a band-pass filter that shifts a filtering frequency range to n filtering frequency ranges corresponding respectively to the n center frequencies.

The band-pass filter unit may include at least one pair of integrators that integrate the first filtered signal and the second filtered signal respectively.

The electronic apparatus may include the sensor pad that includes a plurality of electrodes that correspond to a plurality of channels and apply an electromagnetic field to the coordinate indicating device to generate the electromagnetic signal, and receives the electromagnetic signal, which is generated by the coordinate indicating device in response to the electromagnetic field, through the plurality of electrodes.

According to one or more embodiments, a method for measuring a frequency of a coordinate indicating device includes receiving an electromagnetic signal emitted from the coordinate indicating device contacting on a sensor pad, generating a first filtered signal and a second filtered signal by filtering the electromagnetic signal in a first frequency range and a second frequency range respectively, and acquiring a frequency value of the electromagnetic signal based on a ratio value between the first filtered signal and the second filtered signal and the frequency value of the electromagnetic signal.

The acquiring of the frequency value may include acquiring the frequency value of the electromagnetic signal based on a relation between the ratio value between the first filtered signal and the second filtered signal and the frequency value of the electromagnetic signal.

The generating of the first filtered signal and the second filtered signal may include adjusting the first frequency range and the second frequency range that are respectively a filtering range of a first band-pass filter and a filtering range of a second band-pass filter, and generating the first filtered signal and the second filtered signal by filtering the electromagnetic signal in the adjusted first frequency range and the adjusted second frequency range respectively.

The adjusting of the first frequency range and the second frequency range may include, when a center frequency of the coordinate indicating device changes, adjusting the filtering range of the first band-pass filter and the filtering range of the second band-pass filter to a lower limit and an upper limit value of a variable frequency range according to the center frequency of the coordinate indicating device.

The acquiring of the frequency value may include generating a first integrated signal and a second integrated signal by integrating the first filtered signal and the second filtered signal respectively, and acquiring the frequency value of the electromagnetic signal based on a relation between the frequency value and a ratio value between the first integrated signal and the second integrated signal.

The method may include: applying an electromagnetic signal, which is generated by a plurality of electrodes corresponding to a plurality of channels, to the coordinate indicating device; and receiving the electromagnetic signal, which is generated by the coordinate indicating device in response to the electromagnetic field, through the plurality of electrodes corresponding to the plurality of channels.

The receiving of the electromagnetic signal may include, selecting the electromagnetic signal received from at least one electrode corresponding to at least one channel, among the electromagnetic signals received from the plurality of electrodes corresponding to the plurality of channels; and amplifying and receiving the selected electromagnetic signal.

BRIEF DESCRIPTION OF THE DRAWINGS

These and/or other aspects will become apparent and more readily appreciated from the following description of the embodiments, taken in conjunction with the accompanying drawings in which:

FIG. 8 is a flowchart of a method of measuring a frequency of a coordinate indicating device according to an embodiment.

DETAILED DESCRIPTION

Figure 1:
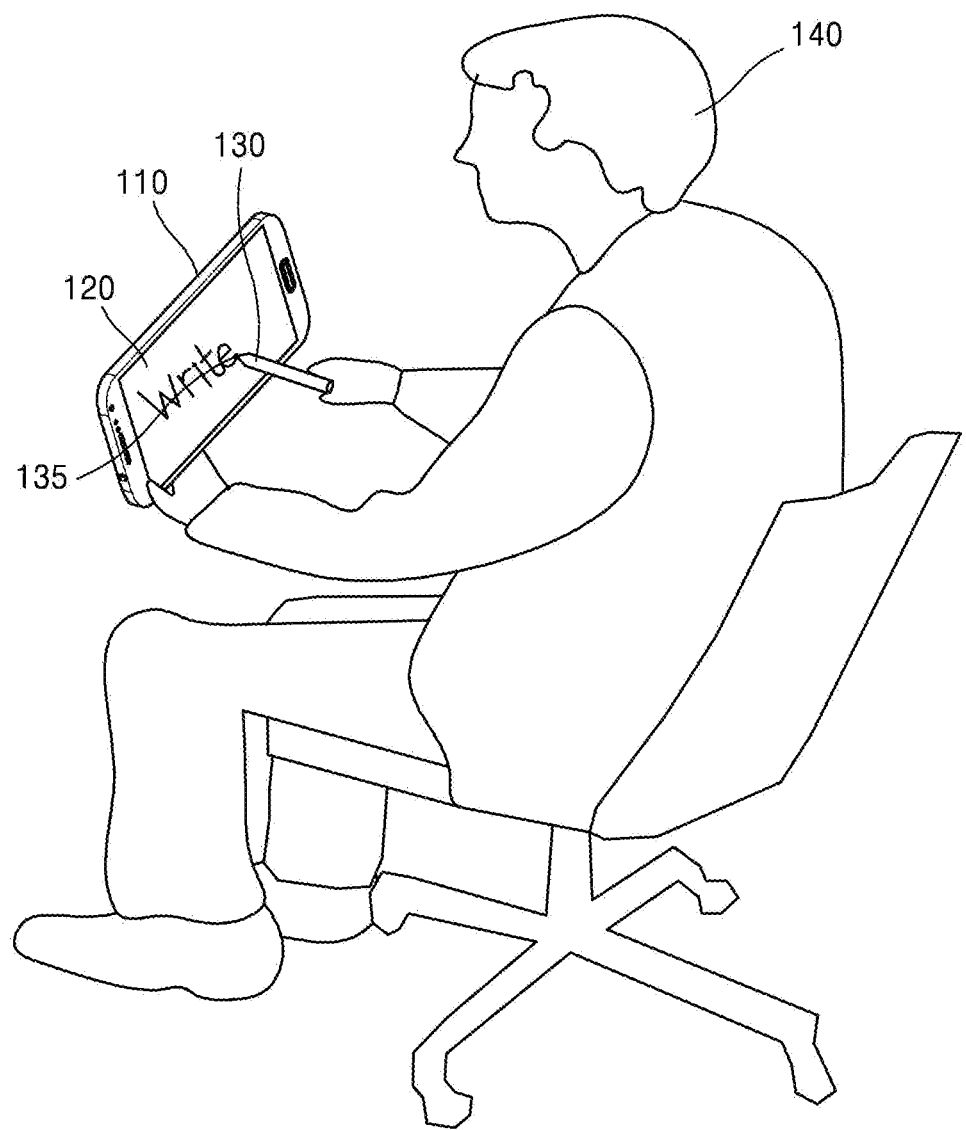
FIG. 1 illustrates an electronic apparatus using a touch screen input method.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are described below, by referring to the figures, to explain aspects of the present description. As used herein, expressions such as "at least one of," when preceding a list of elements, modify the entire list of elements and do not modify the individual elements of the list.

The attached drawings for illustrating exemplary embodiments are referred to facilitate understanding of the present invention. The invention may, however, be embodied in different forms and should not be construed as being limited to the embodiments set forth herein.

Exemplary methods of measuring a frequency of a coordinate indicating device, and electronic apparatuses according to embodiments are described in detail with reference to the accompanying drawings.

FIG. 1 illustrates an electronic apparatus 110 using a touch screen input method, according to an embodiment.

Referring to FIG. 1, the electronic apparatus 110 according to an embodiment includes a display unit 120 including a display panel, and a sensor pad (not illustrated) coupled with a top surface or a bottom surface of the display panel 120. The display unit 120 includes a display panel such as a liquid crystal display (LCD) panel, a plasma display panel (PDP), a light-emitting diode (LED) panel, or an organic light-emitting diode (OLED) panel, and may include a predetermined display.

The sensor pad may be provided in the display panel 120 and may be coupled with a top portion or a bottom portion of the display panel. The sensor pad includes a plurality of electrodes, induces an electromagnetic signal in a coordinate indicating device 130, and receives an electromagnetic signal generated by the coordinate indicating device 130. The sensor pad may generate an electromagnetic field around the electrodes, apply an electric wave signal corresponding to the electromagnetic field to the coordinate indicating device 130, and receive an electromagnetic signal emitted from the coordinate indicating device 130 in response to the applied electric wave signal.

For example, the coordinate indicating device 130 may be a touch pen.

The sensor pad may include an electrode group generating an electromagnetic field and a sensing electrode group receiving an electromagnetic signal.

A case where one electrode group included in the sensor pad generates an electromagnetic field and also receives an electromagnetic signal is described as an example.

When the electronic apparatus 110 is powered off, an alternating current (AC) signal may be applied to the electrodes included in the sensor pad of the display unit 120. When the AC signal is applied to the electrodes, an electric field is generated around the electrodes. When the coordinate indicating device 130 neighbors or contacts the sensor pad, the electric field generated around the electrodes is applied to the coordinate indicating device 130. A capacitor and a coil included in the coordinate indicating device 130 emits an electric signal by resonation. The sensor pad of the electronic apparatus 110 senses the electric signal emitted from the coordinate indicating device 130, and the electronic apparatus 110 may obtain information about a handwriting input via the coordinate indicating device 130 by measuring a frequency of the sensed electric signal.

Referring to FIG. 1, a user 140 may touch a point 135 of the display unit 120 by using the coordinate indicating device 130. By an electric signal sensing operation, the electronic apparatus 110 may generate a handwriting input corresponding to the user's touch and display the same on the display unit 120.

The sensor pad receives the electric signal by using a plurality of electrodes. In electrodes included in the sensor pad and receiving lines connected to the electrodes, a resistance value varies from line to line. A line resistance value may vary depending on the positions on the sensor pad. Accordingly, a time constant value (RC value) representing a signal delay value varies from line to line.

According to an embodiment, the coordinate indicating device 130 may be configured to accurately detect a frequency value of the electromagnetic signal emitted from the coordinate indicating device 130, regardless of the phenomenon in which the resistance value varies from line to line.

Figure 2:
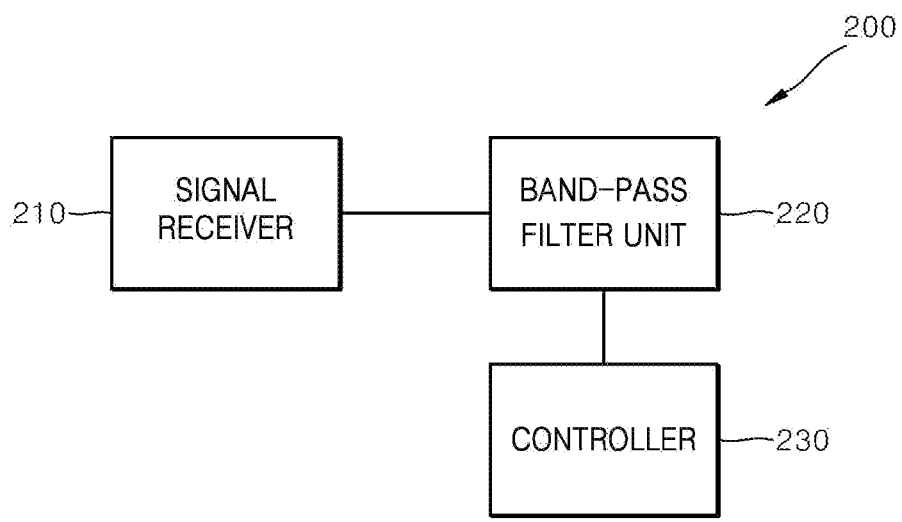
FIG. 2 illustrates an electronic apparatus according to an embodiment.

FIG. 2 illustrates an electronic apparatus 200 according to an embodiment.

Referring to FIG. 2, the electronic apparatus 200 measures a frequency of an electromagnetic signal generated by a coordinate indicating device (not illustrated) that contacts or neighbors a sensor pad (not illustrated), and includes a signal receiving unit 210, a band-pass filter unit 220, and a controller 230. The sensor pad may receive an electromagnetic signal through a plurality of electrodes provided therein. The coordinate indicating device includes an inductor-capacitor (LC) resonance circuit (not illustrated) including a capacitor and an inductor, and may emit an electromagnetic signal in an electromagnetic field.

For example, the sensor pad may receive an electromagnetic signal through a plurality of electrodes in order to support an touch screen input method including an electrostatic-based touch screen input method or an electromagnetic resonance (EMR)-based touch screen input method. The electromagnetic signal may be a signal including at least one of an electric signal component and a magnetic signal component.

The electronic apparatus 200 may be an electronic apparatus, such as a portable computer such as a notebook computer, a netbook computer, or a tablet personal computer (PC); a portable terminal such as a smart phone, a portable multimedia player (PMP), or a personal digital assistant (PDA); or a smart television (TV), that may receive a handwriting input signal through a coordinate indicating device by using a touch screen input method.

The signal receiving unit 210 receives an electromagnetic signal. The electromagnetic signal is a signal that is emitted from the LC resonance circuit included in the coordinate indicating device and is sensed by the sensor pad.

The electromagnetic signal received by the signal receiving unit 210 may be a signal that is obtained by performing noise reduction and amplification on the signal emitted from the LC resonance circuit included in the coordinate indicating device. The noise reduction may be performed by the signal receiving unit 210 or the controller 230.

The band-pass filter unit 220 includes at least one band-pass filter that generates a first filtered signal and a second filtered signal by filtering the electromagnetic signal, which is received by the signal receiving unit 210, in a first frequency range and a second frequency range respectively.

The band-pass filter unit 220 may include a first band-pass filter and a second band-pass filter that have a first frequency range and a second frequency range. The band-pass filter unit 220 may include a band-pass filter that may shift a filtering frequency range.

A case where the band-pass filter unit 220 includes a first band-pass filter and a second band-pass filter that generate a first filtered signal and a second filtered signal respectively will be described as an example.

The first frequency range and the second frequency range may be frequency ranges that are included in a variable frequency range that may vary according to a pen pressure of the coordinate indicating device in consideration of a center frequency of the coordinate indicating device. For example, the first band-pass filter may have a predetermined filtering range based on a lower limit value of the variable frequency range of the coordinate indicating device. The second band-pass filter may have a predetermined filtering range based on an upper limit value of the variable frequency range of the coordinate indicating device.

For example, it may be assumed that the center frequency of the coordinate indicating device is about 500 kHz, the frequency range that may vary according to the pen pressure of the coordinate indicating device with respect to the center frequency of the coordinate indicating device is about 20 kHz, and the electromagnetic signal emitted from the coordinate indicating device has a frequency range of about 480 kHz to about 500 kHz. The first band-pass filter included in the band-pass filter unit 220 may be a band-pass filter that has a filtering center frequency of about 480 kHz that is the lower limit value of the variable frequency range. The second band-pass filter may be a band-pass filter that has a filtering center frequency of about 500 kHz that is the upper limit value of the variable frequency range. A pass band frequency, which is a filtering range of a band-pass filter, may be adjusted according to at least one of the Q-factor, the filtering performance, and the filter characteristics of the band-pass filter with respect to a center frequency of the band-pass filter.

Thus, the filtering range of the band-pass filter may be determined according to a frequency range that may vary with respect to a center frequency of a touch pen.

The controller 230 measures a frequency value of the electromagnetic signal based on a ratio value between the first filtered signal and the second filtered signal.

The controller 230 measures the frequency value of the electromagnetic signal based on a relation between the ratio value between the first filtered signal and the second filtered signal and a predetermined frequency value of the electromagnetic signal emitted from the coordinate indicating device. The controller 230 may use a lookup table representing the relation between the ratio value between the first filtered signal and the second filtered signal and the predetermined frequency value of the electromagnetic signal emitted from the coordinate indicating device. The relation and the lookup table is described with reference to FIG. 4. The controller 230 may use an equation representing the relation between the ratio value between the first filtered signal and the second filtered signal and the predetermined frequency value of the electromagnetic signal emitted from the coordinate indicating device.

Figure 3:
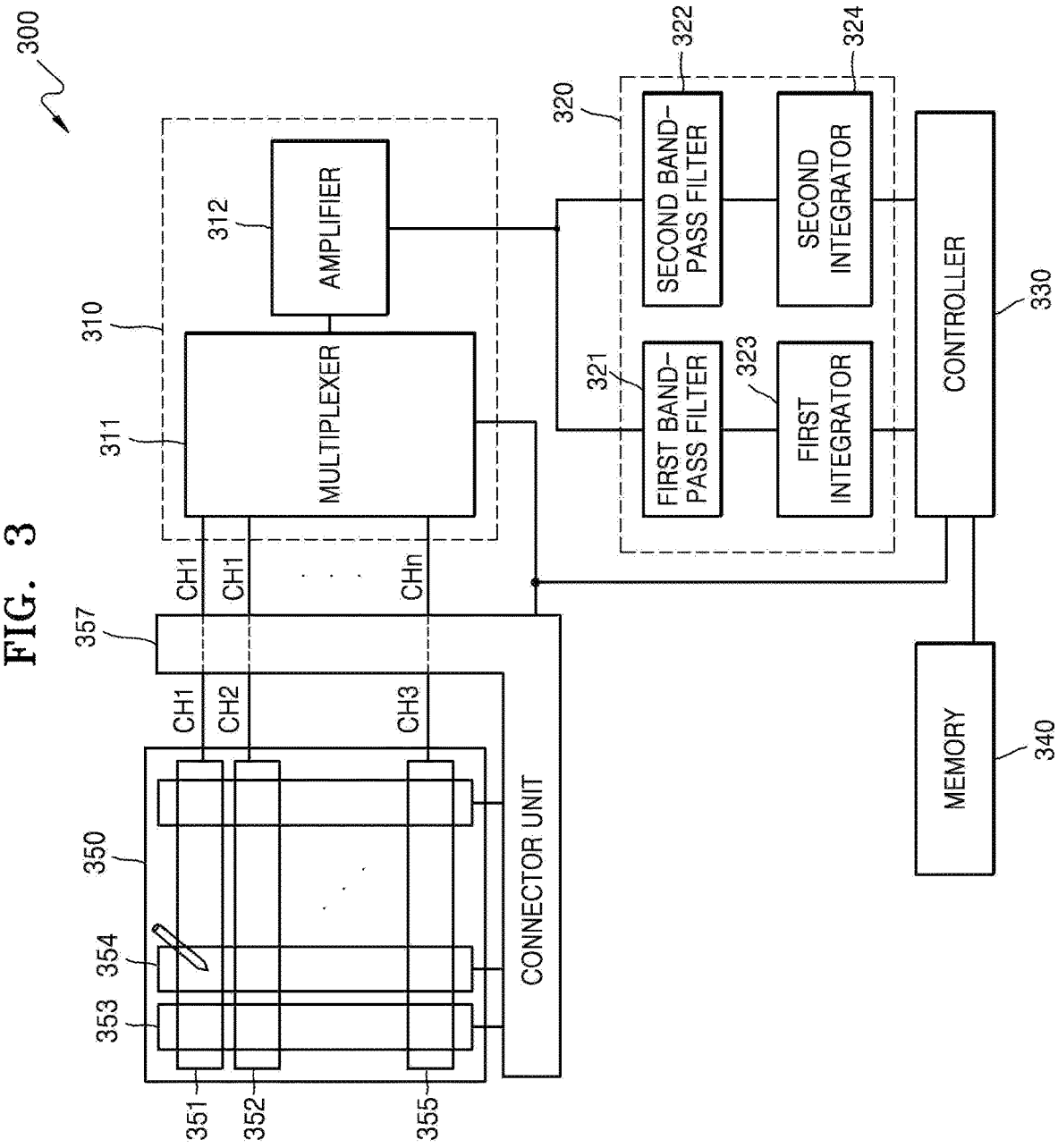
FIG. 3 illustrates an electronic apparatus according to an embodiment.

FIG. 3 illustrates an electronic apparatus 300 according to an embodiment. Referring to FIG. 3, the electronic apparatus 300 includes a signal receiving unit 310, a band-pass filter unit 320, a controller 330, a memory 340, a sensor pad 350, and a connector unit 357.

The electronic apparatus 300 illustrated in FIG. 3 may further include the memory 340, the sensor pad 350, and the connector unit 357 in comparison with the electronic apparatus 200 illustrated in FIG. 2. The signal receiving unit 310, the band-pass filter unit 320, and the controller 330 illustrated in FIG. 3 correspond respectively to the signal receiving unit 210, the band-pass filter unit 220, and the controller 230 illustrated in FIG. 2.

Referring to FIG. 3, the controller 330 controls an overall operation of the electronic apparatus 300. The controller 330 may perform control to form an electromagnetic field around the sensor pad 350 by applying a predetermined AC signal to a plurality of electrodes 351, 352, 353, 354, and 355 included in the sensor pad 350. When the formed electromagnetic field is applied to an LC resonance circuit (not illustrated) included in a coordinate indicating device 305 and thus an electromagnetic signal is emitted from the LC resonance circuit by electromagnetic induction, the controller 330 may perform control to receive the electromagnetic signal emitted from the coordinate indicating device 305.

The sensor pad 350 may include the plurality of electrodes 351, 352, 353, 354, and 355 corresponding to a plurality of channels, and the plurality of electrodes 351, 352, 353, 354, and 355 may be arranged in the directions of one axis and another axis. For example, the electrodes 351, 352, and 355 may be arranged in an x-axis direction, and the electrodes 353 and 354 may be arranged in a y-axis direction.

In the sensor pad 350, an electrode group receiving a predetermined AC signal and forming an electromagnetic field around the sensor pad 350 and an electrode group receiving the electromagnetic signal emitted from the coordinate indicating device 305 may be separately provided.

The connector unit 357 may transmit electromagnetic signals, which are emitted from the coordinate indicating device 305 and are sensed by the sensor pad 350, to the signal receiving unit 310. For example, the connector unit 357 may transmit electromagnetic signals, which are sensed by the electrode 351 corresponding to a first channel CH1, the electrode 352 corresponding to a second channel CH2, and the electrode 355 corresponding to an nth channel CHn, to the signal receiving unit 310.

Noise reduction may be performed by a front end or a rear end of an amplifier 312 or by the controller 330.

The signal receiving unit 310 may include a multiplexer 311 and the amplifier 312.

The multiplexer 311 receives electromagnetic signals from a plurality of electrodes corresponding to a plurality of channels and selects an electromagnetic signal received from at least one electrode corresponding to at least one channel. The multiplexer 311 may select at least one of the electromagnetic signals received from the plurality of electrodes, under the control of the controller 330.

Referring to FIG. 3, the multiplexer 311 may receive electromagnetic signals from the electrode 351 corresponding to the first channel CH1, the electrode 352 corresponding to the second channel CH2, and the electrode 355 corresponding to the nth channel CHn and select the electromagnetic signal received from the electrode 352 corresponding to a touch point of the coordinate indicating device 305. That is, the multiplexer 311 may select a signal received from an electrode disposed at a touch point of the coordinate indicating device 305.

The amplifier 312 amplifies the electromagnetic signal selected by the multiplexer 311 and transmits the amplified signal to the band-pass filter unit 320. Since the electromagnetic signal has a small signal strength, that is, a small magnitude, the electromagnetic signal may be amplified.

The band-pass filter unit 320 may include a first band-pass filter 321 and a second band-pass filter 322 that are a pair of band-pass filters. The band-pass filter unit 320 may include a first integrator 323 and a second integrator 324 that are connected in series to the first band-pass filter 321 and the second band-pass filter 322 respectively.

The first band-pass filter 321 receives an electromagnetic signal and filters a first frequency range to generate a first filtered signal. The first frequency range may be a frequency range corresponding to a lower limit value of the variable frequency range of the coordinate indicating device 305.

The second band-pass filter 322 receives an electromagnetic signal and filters a second frequency range of the coordinate indicating device 305 to generate a second filtered signal. The second frequency range may be a frequency range corresponding to an upper limit value of the variable frequency range of the coordinate indicating device 305.

The filtering ranges of the first and second band-pass filters 321 and 322 may be adjusted according to the center frequency of the coordinate indicating device 305 as described with reference to FIG. 2.

For example, when the coordinate indicating device 305 has one center frequency, the filtering ranges of the first and second band-pass filters 321 and 322 may be set to predetermined values according to the lower limit value and the upper limit value of a variable frequency range around the center frequency.

When the coordinate indicating device 305 has a plurality of center frequencies, the filtering ranges of the first and second band-pass filters 321 and 322 may be adjusted according to a center frequency value in a case where the coordinate indicating device 305 emits an electromagnetic signal.

For example, when the coordinate indicating device 305 has at least one button, the coordinate indicating device 305 may have a plurality of center frequencies. The center frequency of the coordinate indicating device 305 may be about 500 kHz when no button is pressed; the center frequency of the coordinate indicating device 305 may be about 550 kHz when the first button is pressed; and the center frequency of the coordinate indicating device 305 may be about 450 kHz when the second button is pressed. When the center frequency of the coordinate indicating device 305 is about 500 kHz and the frequency may be changed by about 20 kHz by a pen pressure, the variable frequency range is about 480 kHz to about 500 kHz. When the center frequency of the coordinate indicating device 305 is about 550 kHz and the frequency may be changed by about 20 kHz by a pen pressure, the variable frequency range is about 530 kHz to about 550 kHz. When the center frequency of the coordinate indicating device 305 is about 450 kHz and the frequency may be changed by about 20 kHz by a pen pressure, the variable frequency range is about 430 kHz to about 450 kHz.

When an electromagnetic signal emitted when the first button of the coordinate indicating device 305 is pressed is received, a variable frequency range of the received electromagnetic signal is about 530 kHz to about 550 kHz. Thus, the center frequency of the first band-pass filter 321 may be set to about 530 kHz, and a predetermined frequency range may be filtered with respect to the set center frequency. The center frequency of the second band-pass filter 322 may be set to about 550 kHz, and a predetermined frequency range may be filtered with respect to the set center frequency.

The first integrator 323 generates a first integrated signal by integrating the first filtered signal output from the first band-pass filter 321.

The second integrator 324 generates a second integrated signal by integrating the second filtered signal output from the second band-pass filter 322.

The band-pass filter unit 320 may include a band-pass filter. In this case, a first filtered signal and a second filtered signal may be generated by sequentially changing a filtering frequency range in the band-pass filter. The first filtered signal may be generated by setting a filtering frequency range of the band-pass filter to the first frequency range, and then the second filtered signal may be generated by changing the filtering frequency range to the second frequency range. The band-pass filter unit 320 may include an integrator connected to a band-pass filter.

The memory 340 may store a lookup table. The lookup table stored in the memory 340 is used for frequency acquisition. The lookup table may include information representing a relation between a frequency value and a ratio value between the first filtered signal and the second filtered signal. The lookup table may include information representing a relation between a frequency value and a ratio value between the first integrated signal obtained by integrating the first filtered signal and the second integrated signal obtained by integrating the second filtered signal. The lookup table stored in the memory 340 is described with reference to FIG. 5.

The controller 330 calculates a ratio value between the first integrated signal and the second integrated signal. The controller 330 acquires a frequency value matched with the calculated ratio value from the lookup table stored in the memory 340. The controller 330 may acquire the acquired frequency value as the frequency of the coordinate indicating device 305.

Figure 4:
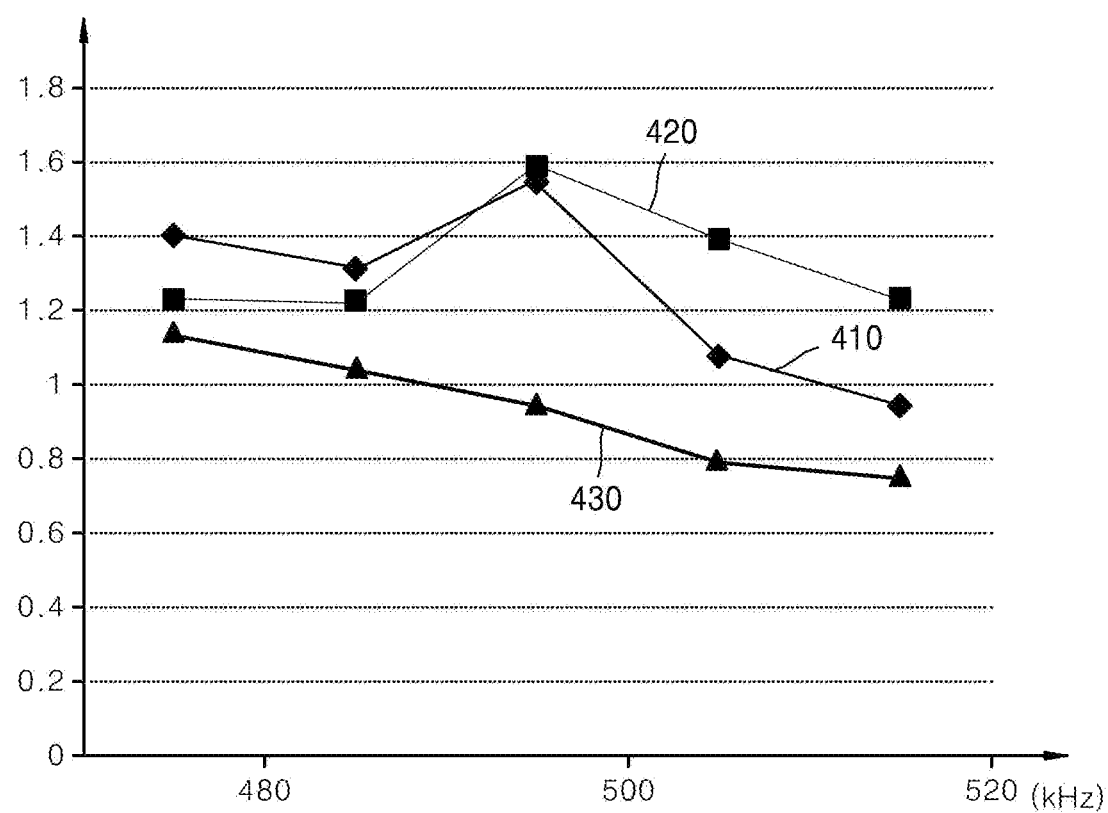
FIG. 4 illustrates an exemplary ratio value between a first filtered signal and a second filtered signal as information included in a lookup table.

FIG. 4 illustrates a ratio value between the first filtered signal and the second filtered signal which is information included in the lookup table. In FIG. 4, an x axis represents a frequency value, and a y axis represents an integrated value of a signal value.

In order to obtain the ratio value between the first filtered signal and the second filtered signal, which is included in the lookup table, the first filtered signal and the second filtered signal may be obtained from the entire frequency range that may vary according to the pen pressure of the coordinate indicating device 305. A frequency value range to be measured is defined, and a signal generated while changing a frequency value within the defined frequency value range by using a signal generator (not illustrated) is applied to the sensor pad 350. The signal received by the sensor pad 350 is input to the band-pass filter unit 320 through the signal receiving unit 310. Then, signals output from the band-pass filter unit 320 are acquired.

For example, assuming that a variable frequency range that may vary according to a pen pressure of the center frequency of the coordinate indicating device 305 is about 480 kHz to about 550 kHz, an output signal of the band-pass filter unit 320 may be acquired in a frequency range of about 480 kHz to about 500 kHz.

Referring to FIG. 4, a curve 410 represents an output value of the band-pass filter having a center frequency of about 500 kHz when the upper limit value of the variable frequency range, for example, the variable frequency range of the above example is applied. The curve 410 may represent a signal value output from the second band-pass filter 322, or an output signal of the second integrator 324 that is obtained by integrating the output signal of the second band-pass filter 322.

A curve 420 represents an output value of the band-pass filter having a center frequency of about 480 kHz when the lower limit value of the variable frequency range, for example, the variable frequency range of the above example is applied. The curve 420 may represent a signal value output from the first band-pass filter 321, or an output signal of the first integrator 323 that is obtained by integrating the output signal of the first band-pass filter 321.

A ratio value between the acquired signal value represented in the curve 410 and the acquired signal value represented in the curve 420 is obtained. For example, when the output signal value of the first integrator 323 obtained by integrating the output signal of the first band-pass filter 321 is "a" and the output signal value of the second integrator 324 obtained by integrating the output signal of the second band-pass filter 322 is "b", the ratio value information included in the lookup table may be "a/b". The ratio value information may be "b/a".

Referring to FIG. 4, a curve 430 represents a ratio value "a/b" between the output signal value "a" of the first integrator 323 obtained by integrating the output signal of the first band-pass filter 321 and the output signal value "b" of the second integrator 324 obtained by integrating the output signal of the second band-pass filter 322.

Figure 5:
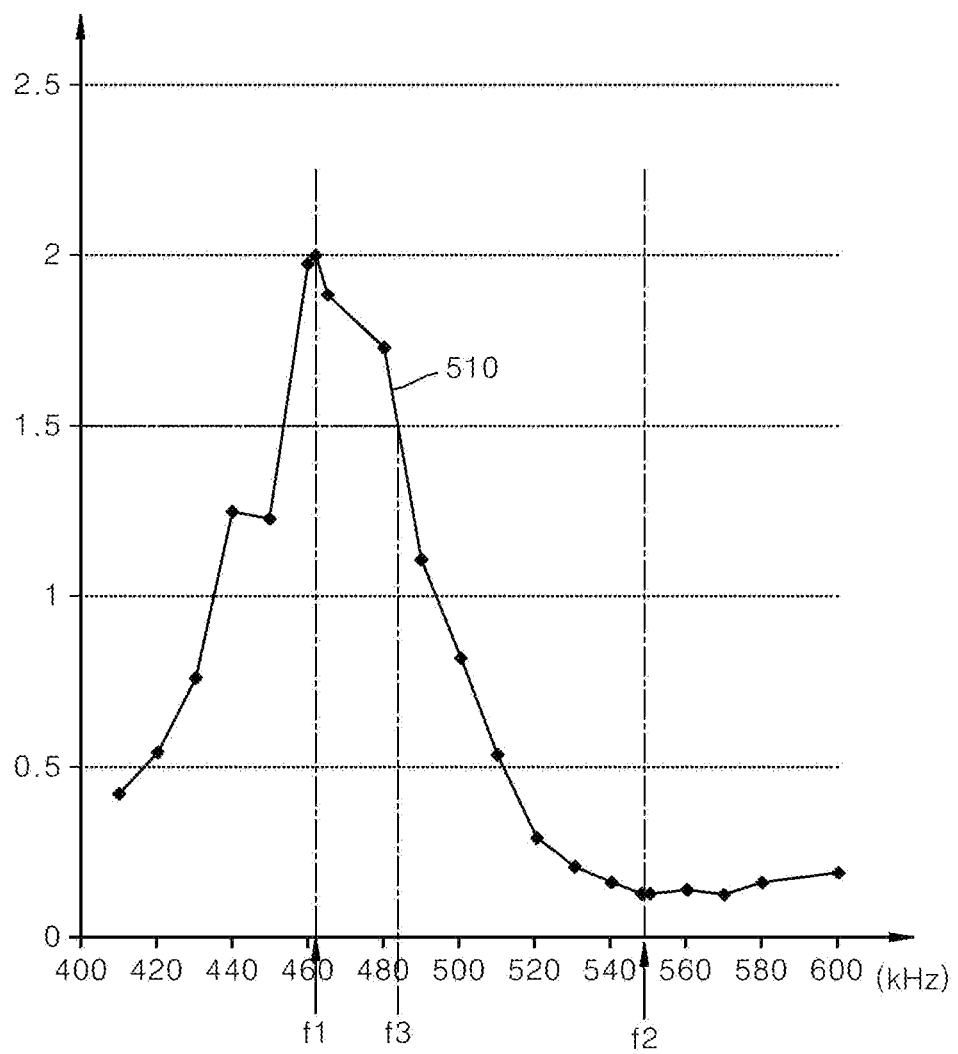
FIG. 5 illustrates a lookup table used in an electronic apparatus according to an embodiment.

FIG. 5 illustrates a lookup table used in an electronic apparatus according to an embodiment or an embodiment. In FIG. 5, an x axis represents a frequency value, and a y axis represents a ratio value between the first filtered signal and the second filtered signal. The y axis represents a ratio value "a/b" between an output signal value "a" of the first integrator 323 obtained by integrating the output signal of the first band-pass filter 321 and an output signal value "b" of the second integrator 324 obtained by integrating the output signal of the second band-pass filter 322. The ratio value between the first filtered signal and the second filtered signal or the ratio value between the integrated value of the first filtered signal and the integrated value of the second filtered signal may be referred to as a ratio value.

The lookup table stored in the memory 340 includes information representing a relation between the frequency value and the ratio value. The electronic apparatus 300 may acquire a lookup table that is information representing a relation between the frequency value and the ratio value while changing the frequency. The memory 340 may receive a generated lookup table from outside and store the received lookup table.

The memory 340 may store an equation representing a relation between the frequency value and the ratio value. When the ratio value is calculated based on the output signal of the band-pass filter unit 320, the frequency value may be acquired by substituting the ratio value to the equation stored in the memory 340. Herein, the equation may correspond to the graph illustrated in FIG. 5.

Referring to FIG. 5, a curve 510 represents a relation between the frequency value and the ratio value and corresponds to the curve 430 of FIG. 4.

The lookup table includes information representing a relation between the frequency value and the ratio value, in a frequency range where there is a monotonic relation between the frequency value and the ratio value between the integrated value of the first filtered signal and the integrated value of the second filtered signal. The monotonic relation represents the relation of a monotonic increase or a monotonic decrease. Since a 1:1 relation exists between the frequency value and the ratio value in the monotonic relation, the frequency value may be estimated based on the ratio value.

Referring to FIG. 5, the lookup table may include information representing a relation between the ratio value and the frequency value in a f1 to f2 frequency range that is a frequency range where there is a monotonic relation in the curve 510. That is, the lookup table may include information of the curve 510 in the f1 to f2 frequency range.

When an electromagnetic signal is output through the band-pass filter unit 320, the controller 330 calculates a ratio value between the first integrator 323 and the second integrator 324 and extracts a corresponding frequency value from the lookup table based on the calculated ratio value. The controller 330 acquires the extracted frequency value as a frequency value of the electromagnetic signal.

For example, when the ratio value between the first filtered signal and the second filtered signal acquired in response to the electromagnetic signal received from the coordinate indicating device 305 is about 1.5, the controller 330 extracts a frequency value "f3" matched with the ratio value "1.5" from the prestored lookup table. The controller 330 may acquire the extracted frequency value "f3" as a frequency value of the electromagnetic signal.

Figure 6:
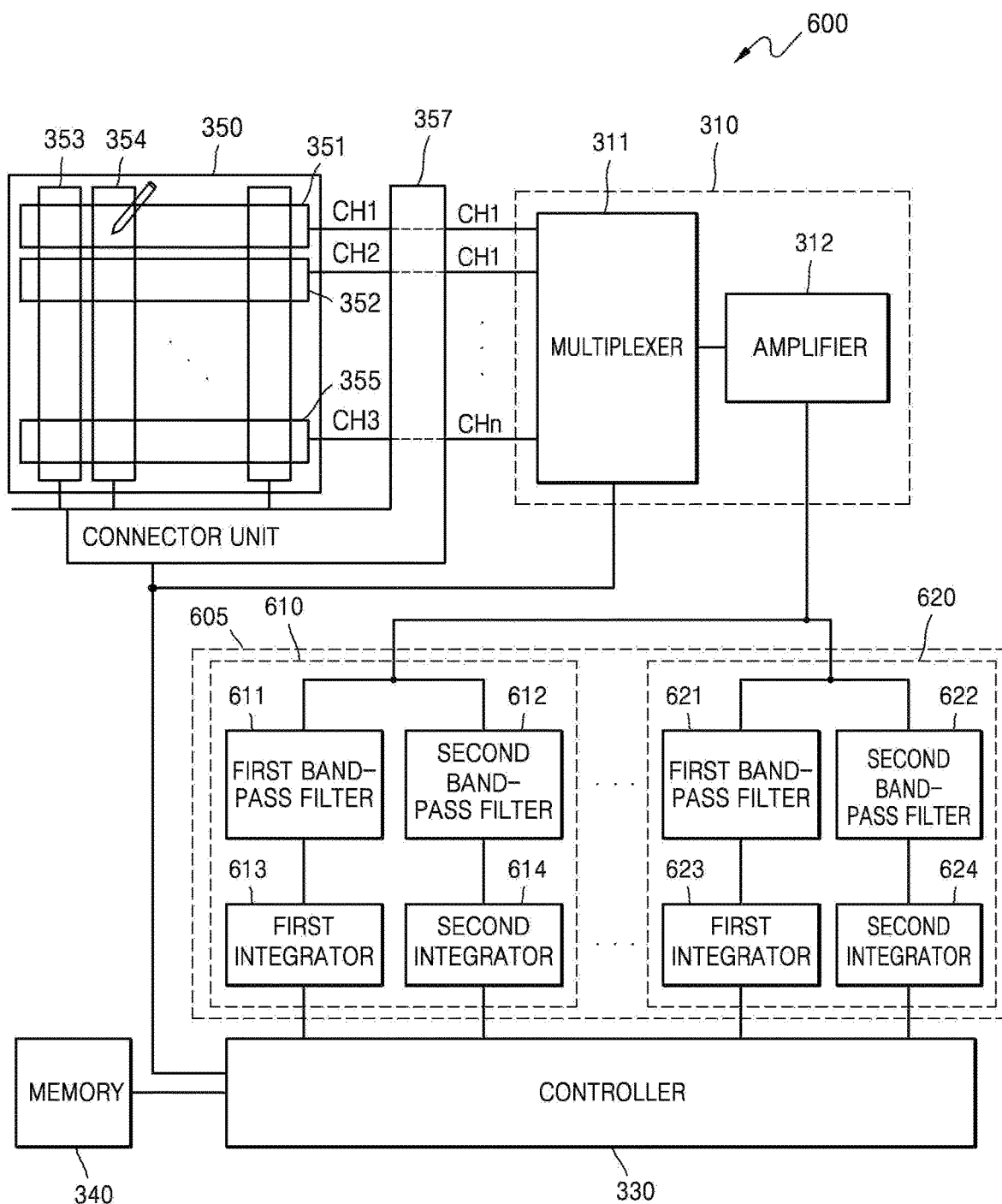
FIG. 6 illustrates an electronic apparatus according to an embodiment.

FIG. 6 illustrates an electronic apparatus 600 according to an embodiment. Since the configuration of the electronic apparatus 600 of FIG. 6 is substantially the same as the configuration of the electronic apparatus 300 of FIG. 3 except for a band-pass filter unit 605, redundant descriptions thereof are omitted.

Referring to FIG. 6, the band-pass filter unit 605 may include a plurality of band-pass filter pairs 610 and 620 corresponding to the number of center frequencies of the coordinate indicating device 305. When the coordinate indicating device 305 has n center frequencies, the band-pass filter unit 605 may include n pairs of band-pass filters corresponding respectively to the n center frequencies. Since each of the band-pass filter pairs 610 and 620 is substantially similar to the band-pass filter unit 320 illustrated in FIG. 3, redundant descriptions thereof will be omitted here.

When the coordinate indicating device 305 has at least one button, the coordinate indicating device 305 may have two center frequencies. The center frequency of the coordinate indicating device 305 may be about 500 kHz when no button is pressed; and the center frequency of the coordinate indicating device 305 may be about 550 kHz when the button is pressed. When the center frequency of the coordinate indicating device 305 is about 500 kHz and the frequency may be changed by about 20 kHz by a pen pressure, the variable frequency range is about 480 kHz to about 500 kHz. When the center frequency of the coordinate indicating device 305 is about 550 kHz and the frequency may be changed by about 20 kHz by a pen pressure, the variable frequency range is about 530 kHz to about 550 kHz. In this case, the band-pass filter unit 605 may include two band-pass filter pairs 610 and 620.

For example, in the first band-pass filter pair 610, when the center frequency of the coordinate indicating device 305 is about 500 kHz, a first band-pass filter 611 may have a center frequency of about 480 kHz and a second band-pass filter 612 may have a center frequency of about 500 kHz. First and second integrators 613 and 614 integrate output signals of the first and second band-pass filters 611 and 612 respectively.

For example, in the second band-pass filter pair 610, when the center frequency of the coordinate indicating device 305 is about 550 kHz, a first band-pass filter 621 may have a center frequency of about 530 kHz and a second band-pass filter 622 may have a center frequency of about 550 kHz. First and second integrators 623 and 624 integrate output signals of the first and second band-pass filters 621 and 622 respectively.

When the coordinate indicating device 305 has a plurality of center frequencies, first and second band-pass filter pairs may be selected according to a center frequency value in a case where the coordinate indicating device 305 emits an electromagnetic signal, and a filtering operation may be performed by using the selected band-pass filter pair.

For example, when the button of the coordinate indicating device 305 is not pressed, the controller 330 may perform control to process the received signal in the first band-pass filter pair 610; and when the button of the coordinate indicating device 305 is pressed, the controller 330 may perform control to process the received signal in the second band-pass filter pair 620.

As described above, the electronic apparatus according to an embodiment or an embodiment may accurately acquire the frequency value of the electromagnetic signal regardless of a change in the line resistance value of the sensor pad, by acquiring the frequency value by using the lookup table including information representing the relation between the ratio value and the frequency value.

The band-pass filter unit 620 may include a band-pass filter. When the coordinate indicating device 305 has a plurality of center frequencies, the controller 330 may change the filtering frequency of the band-pass filter according to the center frequency of the coordinate indicating device 305. When the coordinate indicating device 305 has n center frequencies, the band-pass filter may shift a filtering frequency range to 2n filtering frequency ranges corresponding to the lower limit value and the upper limit value in each of the n center frequencies to generate n first filtered signals and n second filtered signals.

Figure 7:
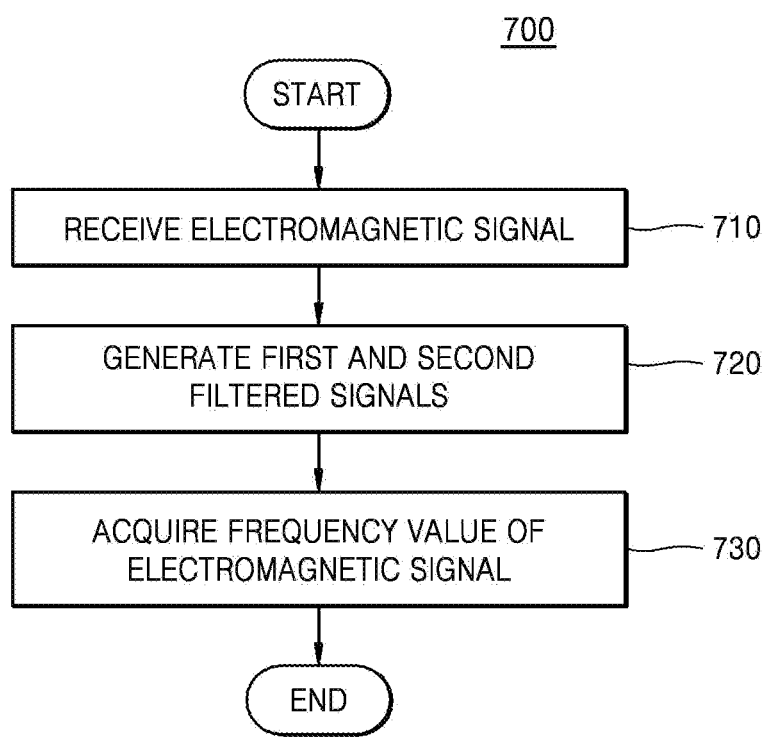
FIG. 7 is a flowchart of a method of measuring a frequency of a coordinate indicating device according to an embodiment.

FIG. 7 is a flowchart of a method 700 of measuring a frequency of the coordinate indicating device 305 according to an embodiment. The method 700 of measuring the frequency of the coordinate indicating device 305, which is illustrated in FIG. 7, includes the same features as the operation of the electronic apparatus 200 according to an embodiment, which has been described with reference to FIG. 2. Thus, redundant descriptions thereof will be omitted here. The method 700 of measuring the frequency of the coordinate indicating device 305 according to an embodiment is described with reference to FIGS. 2 and 7.

Referring to FIG. 7, the method 700 includes measuring a frequency of the electromagnetic signal generated by the coordinate indicating device 305 contacting on the sensor pad.

In the method 700, an electromagnetic signal emitted from the coordinate indicating device 305 contacting or neighboring the sensor pad 350 is received (operation 710). Operation 710 may be performed by the signal receiving unit 210.

The electromagnetic signal is a signal that may be emitted from the LC resonance circuit included in the coordinate indicating device 305 and is sensed by the sensor pad 350. For example, the electromagnetic signal received in operation 710 may be an electromagnetic signal that is emitted from the coordinate indicating device 305 that may implement an electrostatic touch screen input method or an EMR-based touch screen input method.

In the method 700, a first filtered signal and a second filtered signal are generated by filtering the electromagnetic signal in a first frequency range and a second frequency range respectively (operation 720). Operation 720 may be performed by the band-pass filter unit 220. The first frequency range and the second frequency range are frequency ranges that are included in a variable frequency range that may vary according to a pen pressure of the coordinate indicating device 305 in consideration of a center frequency of the coordinate indicating device 305. The first band-pass filter may have a predetermined filtering range based on a lower limit value of the variable frequency range of the coordinate indicating device 305. The second band-pass filter may have a predetermined filtering range based on an upper limit value of the variable frequency range of the coordinate indicating device 305.

In the method 700, a frequency value of the electromagnetic signal based on a ratio value between the first filtered signal and the second filtered signal is acquired (operation 730). Operation 730 may be performed by the controller 230. The controller 230 may acquire the frequency value of the electromagnetic signal based on a relation between the ratio value between the first filtered signal and the second filtered signal and a predetermined frequency value.

FIG. 8 is a flowchart of a method 800 of measuring a frequency of the coordinate indicating device 305 according to an embodiment. The method 800 of measuring the frequency of the coordinate indicating device 305, which is illustrated in FIG. 8, includes the same features as the operation of the electronic apparatus 300 or 600 according to an embodiment, which has been described with reference to FIGS. 1 to 6. Thus, redundant descriptions thereof will be omitted here. Since operations 830, 840, and 860 in the method 800 of measuring the frequency of the coordinate indicating device 305 correspond respectively to operations 710, 720, and 730 in the method 700 of measuring the frequency of the coordinate indicating device 305, redundant description will be omitted here. The method 800 of measuring the frequency of the coordinate indicating device 305 according to an embodiment will be described below in detail with reference to FIGS. 3 and 8.

In the method 800, electromagnetic fields generated by a plurality of electrodes 351, 352, 353, 354, and 355 corresponding to a plurality of channels or electromagnetic signals corresponding to the electromagnetic fields are applied to the coordinate indicating device 305 (operation 810). Operation 810 may be performed by the sensor pad 350 under the control of the controller 330.

In the method 800, the electromagnetic signals generated by the coordinate indicating device 305 are received through the plurality of electrodes 351, 352, 353, 354, and 355 corresponding to the plurality of channels (operation 820). Operation 820 may be performed by the sensor pad 350 under the control of the controller 330.

In the method 800, the electromagnetic signal received from at least one electrode corresponding to at least one channel, is selected among the electromagnetic signals received from the plurality of electrodes 351, 352, 353, 354, and 355 corresponding to the plurality of channels, and the selected electromagnetic signal is amplified (operation 830). Operation 830 may be performed by the multiplexer 311 and the amplifier 312.

In the method 800, a first filtered signal and a second filtered signal are generated by filtering the electromagnetic signal, which is amplified and output in operation 830, in a first frequency range and a second frequency range respectively (operation 840). Operation 840 may be performed by the band-pass filter unit 320. In detail, operation 840 may be performed by the first and second band-pass filters 321 and 322 of the band-pass filter unit 320. In detail, in the method 800, a first filtered signal and a second filtered signal may be generated by filtering the electromagnetic signal, which is amplified and output in operation 830, in a first frequency range and a second frequency range corresponding to a center frequency of the coordinate indicating device 305, respectively.

In detail, in operation 840, by using the first band-pass filter 321, an electromagnetic signal is received and a first frequency range corresponding to a lower limit value of the variable frequency range of the coordinate indicating device 305 is filtered to generate a first filtered signal. Also, by using the second band-pass filter 322, an electromagnetic signal is received and a second frequency range corresponding to an upper limit value of the variable frequency range of the coordinate indicating device 305 is filtered to generate a second filtered signal.

Operation 840 may include an operation of adjusting the filtering ranges of the first and second band-pass filters 321 and 322 according to the center frequency of the coordinate indicating device 305. In detail, when the center frequency of the coordinate indicating device 305 changes, the filtering ranges of the first and second band-pass filters 321 and 322 may be adjusted according to the changed center frequency of the coordinate indicating device 305.

Then, a first filtered signal and a second filtered signal is generated by filtering the electromagnetic signal in the adjusted first and second frequency ranges respectively.

In the above example, when the coordinate indicating device 305 has two buttons, the coordinate indicating device 305 may have three center frequencies. The center frequency of the coordinate indicating device 305 may be about 500 kHz when no button is pressed; the center frequency of the coordinate indicating device 305 may be about 550 kHz when the first button is pressed; and the center frequency of the coordinate indicating device 305 may be about 450 kHz when the second button is pressed. When the center frequency of the coordinate indicating device 305 is about 500 kHz and the frequency may be changed by about 20 kHz by a pen pressure, the variable frequency range is about 480 kHz to about 500 kHz. When the center frequency of the coordinate indicating device 305 is about 550 kHz and the frequency may be changed by about 20 kHz by a pen pressure, the variable frequency range is about 530 kHz to about 550 kHz. When the center frequency of the coordinate indicating device 305 is about 450 kHz and the frequency may be changed by about 20 kHz by a pen pressure, the variable frequency range is about 430 kHz to about 450 kHz.

When the user performs a handwriting input without pressing the button of the coordinate indicating device 305, the filtering ranges of the first and second band-pass filters 321 and 322 correspond to a case where the center frequency of the coordinate indicating device 305 is about 500 kHz. Thus, the first band-pass filter 321 may have a center frequency of about 480 kHz, and the second band-pass filter 322 may have a center frequency of about 500 kHz.

Thereafter, when the user performs a handwriting input while pressing the first button of the coordinate indicating device 305, the filtering ranges of the first and second band-pass filters 321 and 322 correspond to a case where the center frequency of the coordinate indicating device 305 is about 550 kHz. Thus, the center frequency of the first band-pass filter 321 is adjusted to about 530 kHz, and the filtering range of the first band-pass filter 321 is adjusted accordingly. Also, the center frequency of the second band-pass filter 322 is adjusted to about 550 kHz, and the filtering range of the second band-pass filter 322 is adjusted accordingly.

In the method 800, a first integrated signal and a second integrated signal are generated by integrating the first filtered signal and the second filtered signal respectively (operation 850). Operation 850 may be performed by the first and second integrators 323 and 324 of the band-pass filter unit 320.

In the method 800, a frequency value of the electromagnetic signal is acquired based on a ratio value between the first integrated signal and the second integrated signal (operation 860). Operation 860 may be performed by the controller 330.

The embodiments may be written as a program and may be implemented in a general-purpose digital computer that executes the program by using a computer-readable recording medium.

Examples of the computer-readable recording medium include magnetic storage media (e.g., ROM, floppy disks, hard disks, etc.), optical recording media (e.g., CD-ROMs, DVDs, etc.), and transmission media such as Internet transmission media.

It should be understood that the exemplary embodiments described herein should be considered in a descriptive sense only and not for purposes of limitation. Descriptions of features or aspects within each embodiment should typically be considered as available for other similar features or aspects in other embodiments.

While one or more embodiments have been described with reference to the figures, it will be understood by those of ordinary skill in the art that various changes in form and details may be made therein without departing from the spirit and scope as defined by the following claims.

What is claimed is:

1. An electronic apparatus configured to determine a frequency of an electromagnetic signal, the electronic apparatus comprising:
a signal receiver configured to receive the electromagnetic signal emitted from a coordinate indicating device configured to emit a frequency in a range of a predetermined center frequency upon contacting a sensor pad;
a band-pass filter device comprising at least one band-pass filter configured to respectively generate a first filtered signal and a second filtered signal by filtering the received electromagnetic signal in an adjustable first frequency range, the adjustable first frequency range having a first center frequency based on a first value of the range and the predetermined center frequency of the coordinate indicating device and an adjustable second frequency range having a second center frequency based on a second value of the range and the predetermined center frequency of the coordinate indicating device;
a controller configured to generate a first integrated signal and a second integrated signal by integrating the generated first filtered signal and the generated second filtered signal respectively and to detect a frequency value of the received electromagnetic signal based on a ratio value between the generated first integrated signal and the generated second integrated signal, to measure a pressure of the coordinate indicating device; and
a memory configured to store a lookup table usable by the controller to calculate the ratio value.

2. The electronic apparatus of claim 1, wherein the controller is further configured to obtain the frequency value of the electromagnetic signal emitted from the coordinate indicating device based on a relation between the ratio value between the generated first filtered signal and the generated second filtered signal and the predetermined center frequency value.

3. The electronic apparatus of claim 2, wherein the memory is configured to store the lookup table representing the relation between the ratio value and the predetermined center frequency value.

4. The electronic apparatus of claim 2, wherein the memory is configured to store an equation representing the relation between the frequency value and the ratio value, and
wherein the controller is further configured to obtain the frequency value by using the equation.

5. The electronic apparatus of claim 1, wherein
the at least one band-pass filter is a first band-pass filter and the electronic apparatus includes a second band-pass filter,
the first band-pass filter is configured to input the received electromagnetic signal and filter the first frequency range to generate the first filtered signal, and
the second band-pass filter is configured to input the received electromagnetic signal and filter the second frequency range to generate the second filtered signal.

6. The electronic apparatus of claim 1, wherein the at least one band-pass filter is further configured to input the received electromagnetic signal and filter the first frequency range in the electromagnetic signal to generate the first filtered signal, and then filter the second frequency range in the electromagnetic signal to generate the second filtered signal.

7. The electronic apparatus of claim 1, wherein the band-pass filter device comprises n pairs of band-pass filters corresponding respectively to n predetermined center frequencies of the electromagnetic signal emittable from the coordinate indicating device.

8. The electronic apparatus of claim 1, wherein the band-pass filter device comprises at least one band-pass filter configured to shift a filtering frequency range to n filtering frequency ranges based on respectively the n predetermined center frequencies of the electromagnetic signal emittable from the coordinate indicating device.

9. The electronic apparatus of claim 1, wherein the band-pass filter device comprises at least one pair of integrators configured to integrate the generated first filtered signal and the generated second filtered signal respectively.

10. The electronic apparatus of claim 1, wherein the sensor pad comprises a plurality of electrodes that correspond to a plurality of channels and is configured to apply an electromagnetic field to the coordinate indicating device to generate the electromagnetic signal, and to receive the electromagnetic signal, which is generated by the coordinate indicating device in response to the electromagnetic field, through the plurality of electrodes.

11. A method of determining a frequency of a coordinate indicating device, the method comprising:
    receiving an electromagnetic signal emitted from the coordinate indicating device, configured to emit a frequency in a range of a predetermined center frequency, contacting a sensor pad of the electronic device;
    generating, respectively, a first filtered signal and a second filtered signal by filtering the received electromagnetic signal in an adjustable first frequency range, the adjustable first frequency range having a first center frequency based on a first value of the range and the predetermined center frequency of the coordinate indicating device and an adjustable second frequency range having a second center frequency based on a second value of the range and the predetermined center frequency of the coordinate indicating device;
    generating a first integrated signal and a second integrated signal by integrating the generated first filtered signal and the generated second filtered signal respectively; and
    detecting a frequency value of the received electromagnetic signal based on a ratio value between the generated first integrated signal and the generated second integrated signal, to measure a pressure of the coordinate indicating device.

12. The method of claim 11, wherein the acquiring of the frequency value comprises acquiring the frequency value of the received electromagnetic signal based on a relation between the ratio value between the generated first filtered signal and the generated second filtered signal and the predetermined center frequency value.

13. The method of claim 12, further comprising:
    applying an electromagnetic signal, which is generated by a plurality of electrodes of the sensor pad corresponding to a plurality of channels, to the coordinate indicating device; and
    receiving the electromagnetic signal from the coordinate indicating device in response to the electromagnetic field, through the plurality of electrodes corresponding to the plurality of channels.

14. The method of claim 13, wherein the receiving of the electromagnetic signal comprises:
    selecting the electromagnetic signal received from at least one electrode corresponding to at least one channel, among the electromagnetic signals received from the plurality of electrodes corresponding to the plurality of channels; and
    amplifying and receiving the selected electromagnetic signal.

15. The method of claim 11, wherein the generating of the first filtered signal and the second filtered signal comprises:
    adjusting the adjustable first frequency range and the adjustable second frequency range that are respectively an adjustable filtering range of a first band-pass filter and an adjustable filtering range of a second band-pass filter; and
    generating the first filtered signal and the second filtered signal by filtering the electromagnetic signal in the adjusted first frequency range and the adjusted second frequency range respectively.

16. The method of claim 15, wherein the adjusting of the adjustable first frequency range and the adjustable second frequency range comprises, when a the predetermined center frequency of the coordinate indicating device changes, adjusting the filtering range of the adjustable first band-pass filter and the adjustable filtering range of the second band-pass filter to a lower limit and an upper limit value of a variable frequency range according to the changed center frequency of the coordinate indicating device.

17. An electronic apparatus configured to measure a frequency of an electromagnetic signal, the electronic apparatus comprising:
    a signal receiver configured to receive the electromagnetic signal emitted from a coordinate indicating device configured to emit a frequency in a range of a predetermined center frequency device;
    a band-pass filter device comprising at least one band-pass filter configured to generate a first filtered signal and a second filtered signal by filtering the received electromagnetic signal respectively in an adjustable first frequency range having a first center frequency based on the range and the predetermined center frequency of the coordinate indicating device and an adjustable second frequency range having a second center frequency based on the range and the predetermined center frequency of the coordinate indicating device;
    a controller configured to generate a first integrated signal and a second integrated signal by integrating the generated first filtered signal and the generated second filtered signal respectively and to detect a frequency value of the received electromagnetic signal based on a ratio value between the generated first integrated signal and the generated second integrated signal, to measure a pressure of the coordinate indicating device; and
    a memory configured to store a lookup table usable by the controller to calculate the ratio value.

* * * * *